(12) United States Patent
Tsuchiya et al.

(10) Patent No.: US 9,566,685 B2
(45) Date of Patent: Feb. 14, 2017

(54) POLISHING COMPOSITION AND METHOD FOR PRODUCING POLISHED ARTICLE

(71) Applicant: FUJIMI INCORPORATED, Kiyosu-shi, Aichi (JP)

(72) Inventors: Kohsuke Tsuchiya, Kiyosu (JP); Hisanori Tansho, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/769,377

(22) PCT Filed: Feb. 14, 2014

(86) PCT No.: PCT/JP2014/053540
§ 371 (c)(1),
(2) Date: Aug. 20, 2015

(87) PCT Pub. No.: WO2014/129408
PCT Pub. Date: Aug. 28, 2014

(65) Prior Publication Data
US 2016/0001416 A1    Jan. 7, 2016

(30) Foreign Application Priority Data
Feb. 21, 2013  (JP) ................................. 2013-032464

(51) Int. Cl.
| | | |
|---|---|---|
| *B24B 37/04* | (2012.01) | |
| *H01L 21/02* | (2006.01) | |
| *C09K 3/14* | (2006.01) | |
| *C09G 1/02* | (2006.01) | |
| *H01L 21/306* | (2006.01) | |

(52) U.S. Cl.
CPC ............... *B24B 37/044* (2013.01); *C09G 1/02* (2013.01); *C09K 3/1463* (2013.01); *H01L 21/02024* (2013.01); *H01L 21/30625* (2013.01)

(58) Field of Classification Search
CPC ....... B24B 37/044; C09K 3/1463; C09G 1/02; H01L 21/02024
USPC ......................................................... 451/41
See application file for complete search history.

(56) References Cited

U.S. PATENT DOCUMENTS

| | | | | |
|---|---|---|---|---|
| 3,536,683 | A * | 10/1970 | Cooper ..................... | C08F 6/22 |
| | | | | 526/254 |
| 3,874,129 | A | 4/1975 | Deckert et al. | |
| 5,860,848 | A * | 1/1999 | Loncki .................. | B24B 37/044 |
| | | | | 451/285 |
| 6,560,923 | B1 * | 5/2003 | Kamei ................. | A01G 31/001 |
| | | | | 47/64 |
| 2004/0098924 | A1 | 5/2004 | Iwasa | |
| 2007/0186485 | A1 | 8/2007 | Iwasa | |
| 2007/0186486 | A1 | 8/2007 | Iwasa | |
| 2008/0081541 | A1 * | 4/2008 | Kozasa ............. | H01L 21/02024 |
| | | | | 451/36 |
| 2009/0047786 | A1 | 2/2009 | Fukasawa et al. | |
| 2011/0081780 | A1 | 4/2011 | Shida et al. | |
| 2013/0181159 | A1 | 7/2013 | Tsuchiya et al. | |
| 2015/0017806 | A1 | 1/2015 | Akutsu et al. | |
| 2015/0232704 | A1 | 8/2015 | Akutsu et al. | |

FOREIGN PATENT DOCUMENTS

| | | |
|---|---|---|
| EP | 2 444 996 A1 | 4/2012 |
| JP | S49-76470 A | 7/1974 |
| JP | H08-113772 A | 5/1996 |
| JP | 2004-128089 A | 4/2004 |
| JP | 2006-352042 A | 12/2006 |
| JP | 2010-028080 A | 2/2010 |
| JP | 2012-079964 A | 4/2012 |
| WO | WO-2007/088868 A1 | 8/2007 |
| WO | WO-2012/043418 A1 | 4/2012 |
| WO | WO-2012/090755 A1 | 7/2012 |
| WO | WO-2013/125441 A1 | 8/2013 |
| WO | WO-2013/125446 A1 | 8/2013 |
| WO | WO-2014/034358 A1 | 3/2014 |
| WO | WO-2014/034379 A1 | 3/2014 |

\* cited by examiner

*Primary Examiner* — George Nguyen
(74) *Attorney, Agent, or Firm* — Foley & Lardner LLP

(57) ABSTRACT

This invention provides a polishing composition comprising an abrasive, a water-soluble polymer and water. The water-soluble polymer comprises a polymer A having an adsorption ratio of lower than 5% and a polymer B having an adsorption ratio of 5% or higher, but lower than 95% based on a prescribed adsorption ratio measurement. Herein, the polymer B is selected from polymers excluding hydroxyethyl celluloses.

10 Claims, No Drawings

POLISHING COMPOSITION AND METHOD FOR PRODUCING POLISHED ARTICLE

TECHNICAL FIELD

The present invention relates to a polishing composition used for polishing a polishing object. In particular, it relates to a polishing composition used primarily for polishing semiconductor substrates such as silicon wafers and the like as well as other substrates.

The present application claims priority to Japanese Patent Application No. 2013-032464 filed on Feb. 21, 2013, the entire contents of which are incorporated herein by reference.

BACKGROUND ART

The surface of a silicon wafer used as a component of a semiconductor device, etc., is generally polished to a high quality mirror finished via a lapping step (rough polishing step) and a polishing step (precision polishing step). The polishing step typically comprises a first polishing step and a final polishing step. Patent Documents 1 to 4 are cited as technical literatures related to polishing compositions used primarily for polishing semiconductor substrates such as silicon wafers, etc.

CITATION LIST

Patent Literature

[Patent Document 1] International Publication No. 2012/043418
[Patent Document 2] Japanese Patent Application Publication No. 2004-128089
[Patent Document 3] Japanese Patent Application Publication No. S49-76470
[Patent Document 4] Japanese Patent Application Publication No. H8-113772

SUMMARY OF INVENTION

Technical Problem

Polishing compositions (especially polishing compositions for precision polishing) for polishing semiconductor substrates such as silicon wafers as well as other substrates are expected to have abilities to produce surfaces with low haze and a fewer number of micro particles (light point defect or LPD) after polishing. Many of polishing compositions for such purposes comprise, besides water and an abrasive, a water-soluble polymer for protecting the surface of a polishing object (work piece) or increasing the wettability, etc. of the same. Among them, hydroxyethyl cellulose is cited as a widely used water-soluble polymer.

However, since hydroxyethyl cellulose (HEC) is a polymer derived from a natural compound (cellulose), there are limitations in managing the chemical structure and purity as compared with a polymer obtainable by artificial polymerization of monomers (or a synthetic polymer, hereinafter). For instance, because the structural control is harder than for synthetic polymers, commercially readily available HECs are limited in weight average molecular weight and range of molecular weight distribution (ratio of weight average molecular weight (Mw) to number average molecular weight (Mn)). In addition, since they are derived from natural compounds, it is difficult to significantly reduce impurities and local disorder (microscale aggregation, etc.) in their polymer structures, etc., that may cause surface defect, and the amounts and extent of such impurities, etc. are likely to vary easily. As more strict requirements are expected for surface quality in the future, it will be useful to provide a polishing composition excellent in reducing the number of LPD and haze, with the composition not essentially requiring an HEC.

In view of such circumstances, an objective of the present invention is to provide a polishing composition excellent in reducing the number of LPD and haze. Another related invention provides a method for producing a polished article, using such a polishing composition.

Solution to Problem

The polishing composition provided by this specification comprises an abrasive, a water-soluble polymer and water. The polishing composition comprises, as the water-soluble polymer, a polymer A having an adsorption ratio of lower than 5% based on the adsorption ratio measurement described below and a polymer B having an adsorption ratio of 5% or higher, but lower than 95% based on the adsorption measurement. Herein, the polymer B is selected from polymers excluding hydroxyethyl celluloses.

[Adsorption Ratio Measurement]
(1) A test solution L0 is obtained, comprising 0.018% by mass of a measured polymer and 0.01% by mass of ammonia with the rest being water.
(2) A test solution L1 is obtained, comprising 0.18% by mass of the abrasive as well as 0.018% by mass of the measured polymer and 0.01% by mass of ammonia with the rest being water.
(3) The test solution L1 is centrifuged to precipitate the abrasive.
(4) From the mass W0 of the measured polymer in the test solution L0 and mass W1 of the measured polymer in the supernatant of the centrifuged test solution L1, the adsorption ratio of the measured polymer is determined by the next equation:

$$\text{Adsorption ratio (\%)} = [(W0-W1)/W0] \times 100$$

According to such a polishing composition, the combined use of the polymer A and polymer B showing the respective prescribed adsorption ratios relative to the abrasive can effectively improve the performance (e.g. reduction of the number of LPD, reduction of haze, etc.) of the polishing composition.

A preferable polymer B has a weight average molecular weight (Mw) to number average molecular weight (Mn) ratio (Mw/Mn; "molecular weight distribution", hereinafter) of 5.0 or lower. The use of a polymer B with such a narrow molecular weight distribution can bring about effects such as prevention of aggregate formation in the polishing composition, reduction of the number of micro particles (light point defect or LPD) in the polished surface, and so on.

A preferable polymer B has a Mw of $1 \times 10^4$ or larger, but smaller than $25 \times 10^4$. A polymer B satisfying such a Mw is preferable from the standpoint of the ease of filtration and washing (ease of elimination from the polished surface) of the polishing composition containing the polymer B.

As the polymer B, a nonionic polymer can be preferably used from the standpoint of the suitable adsorbability to the abrasive and a polishing object (work piece) and unlikelihood of causing the occurrence of aggregates or lowering of washability due to excessive adsorbability.

From the standpoint of improving the polishing work, a nitrogen atom-containing polymer (e.g. a polymer containing a pendant group (side chain) having an amide bond) can be preferably used as the polymer B. Preferable examples of the polymer B in the art disclosed herein include nitrogen atom-containing nonionic polymers.

A polyvinyl alcohol is an example of a polymer that can be preferably used as the polymer A. The combined use of a polyvinyl alcohol and the polymer B as the water-soluble polymer may effectively improve the performance (e.g. reduction of the number of LPD, reduction of haze, etc.) of the polishing composition.

The polishing composition disclosed herein can be preferably made in an embodiment further comprising a basic compound, in addition to the abrasive, water-soluble polymer and water. According to the polishing composition in such an embodiment, the polishing efficiency can be increased by the effect of the basic compound.

The polishing composition disclosed herein can be preferably used for polishing a silicon wafer. A polishing composition comprising the polymer A and the polymer B in combination can yield a higher-quality silicon wafer surface.

This specification also provides a method for producing a polished article (e.g. silicon wafer), using a polishing composition disclosed herein. The method comprises supplying a polishing liquid (the term "liquid" herein encompasses a slurry) to a polishing object (an article to be polished or a work piece). The method further comprises polishing a surface of the polishing object with the polishing liquid. According to such a production method, a high-quality polished article (e.g. a polished article with fewer LPD and low haze) can be produced.

The art disclosed herein can be preferably applied to polishing a silicon wafer, for instance, a lapped silicon wafer. An example of particularly preferable applications is final polishing of a silicon wafer.

DESCRIPTION OF EMBODIMENTS

Preferred embodiments of the present invention are described below. Matters necessary to implement this invention other than those specifically referred to in this specification may be understood as design matters to a person of ordinary skill in the art based on the conventional art in the pertinent field. The present invention can be implemented based on the contents disclosed in this specification and common technical knowledge in the subject field. In the present specification, the terms "weight" and "mass," "% by weight" and "% by mass," and "parts by weight" and "parts by mass" are used synonymously.
<Abrasive>

The material and properties of the abrasive in the polishing composition disclosed herein are not particularly limited and can be suitably selected in accordance with the purpose and application of the polishing composition, etc. Examples of the abrasive include inorganic grains, organic grains and organic/inorganic composite grains. Specific examples of inorganic grains include oxide grains such as silica grains, alumina grains, cerium oxide grains, chromium oxide grains, titanium dioxide grains, zirconium oxide grains, magnesium oxide grains, manganese dioxide grains, zinc oxide grains, red oxide grains, etc.; nitride grains such as silicon nitride grains, boron nitride grains, etc.; carbide grains such as silicon carbide grains, boron carbide grains, etc.; diamond grains; carbonates such as calcium carbonate, barium carbonate, etc.; and the like. Specific examples of organic grains include polymethyl methacrylate (PMMA) grains, poly(meth)acrylic acid grains (herein the (meth)acrylic acid comprehensively means acrylic acid and methacrylic acid), polyacrylonitrile grains, and the like. These abrasives can be used singly as one species or in a combination of two or more species.

As the abrasive, inorganic grains are preferable. In particular, grains of an oxide of a metal or metalloid are preferable. Preferable examples of the abrasive that can be used in the art disclosed herein include silica grains. For instance, the use of silica grains as the abrasive is particularly preferable when applying the art disclosed herein to a polishing composition that can be used for polishing a silicon wafer. This is because when the polished article is a silicon wafer, the use of silica grains formed of oxygen atoms and the same element as the polished article will not leave metal or metalloid residues that are not silicon after the polishing, eliminating risks such as contamination of the silicon wafer surface and degradation of electrical properties of the silicon wafer caused by dispersion of metal or metalloid residues that are not silicon in the polished article. An example of an embodiment of the polishing composition preferable from such a standpoint is a polishing composition consisting of silica grains as the abrasive. By nature, silica can be readily obtained in a highly pure state. This is also one of the reasons that silica grains are preferable as the abrasive. Specific examples of silica grains include colloidal silica, fumed silica, precipitated silica and the like. From the standpoint of the less likelihood of scratching the polishing object's surface and capability of making a surface with lower haze, colloidal silica and fumed silica are cited as preferable silica grains. Colloidal silica is particularly preferable. For instance, colloidal silica is preferably used as the abrasive in the polishing composition used for polishing (especially, final polishing) of a silicon wafer.

The silica constituting the silica grains has a true specific gravity of preferably 1.5 or higher, more preferably 1.6 or higher, or yet more preferably 1.7 or higher. With increasing true specific gravity of the silica, the polishing rate (amount of surface removed from polishing object's surface per unit time) may increase when polishing a polishing object (e.g. silicon wafer). From the standpoint of reducing scratches occurring in the surface (polished surface) of the polishing object, preferable silica grains have a true specific gravity of 2.2 or lower. As the true specific gravity of the silica, the value measured by a liquid displacement method using ethanol as the displacing liquid can be used.

In the art disclosed herein, the abrasive in the polishing composition can be in a form of primary particles or in a form of secondary particles which are aggregates of primary particles. Alternatively, the abrasive may be present both in the primary particle form and secondary particle form. In a preferable embodiment, the abrasive is present at least partially in a secondary particle form in the polishing composition.

The average primary particle diameter $D_{P1}$ is not particularly limited. From the standpoint of the polishing efficiency, etc., it is preferably 5 nm or larger, or more preferably 10 nm or larger. From the standpoint of obtaining greater effects of polishing (e.g. effects such as reduced haze, removal of defects, etc.), the average primary particle diameter $D_{P1}$ is preferably 15 nm or larger, or more preferably 20 nm or larger (e.g. larger than 20 nm). From the standpoint of the likelihood of yielding a highly smooth surface, the abrasive has an average primary particle diameter $D_{P1}$ of preferably 100 nm or smaller, more preferably 50 nm or smaller, or yet more preferably 40 nm or smaller. From the standpoint of the likelihood of obtaining a higher-quality surface (e.g. a surface with reduced defect such as LPD, PID (polishing induced defect), etc.), the art disclosed herein can also be preferably implemented in an embodiment using an abrasive having an average primary particle diameter $D_{P1}$ of 35 nm or smaller (more preferably 32 nm or smaller, e.g. smaller than 30 nm).

In the art disclosed herein, the abrasive's average primary particle diameter $D_{P1}$ can be determined, for instance, from the specific surface area S (m²/g) measured by the BET method, based on the equation for the average primary particle diameter $D_{P1}$ (nm)=2720/S. The abrasive's specific surface area can be measured by using, for instance, a surface area analyzer under trade name "FLOW SORB II 2300" available from Micromeritics.

The average secondary particle diameter $D_{P2}$ of the abrasive is not particularly limited. From the standpoint of the polishing rate, etc., it is preferably 10 nm or larger, or more preferably 20 nm or larger. From the standpoint of obtaining greater effects of polishing, the average secondary particle diameter $D_{P2}$ is preferably 30 nm or larger, more preferably 35 nm or larger, or yet more preferably 40 nm or larger (e.g. larger than 40 nm). From the standpoint of yielding a highly smooth surface, the abrasive has an average secondary particle diameter $D_{P2}$ of suitably 200 nm or smaller, preferably 150 nm or smaller, or more preferably 100 nm or smaller. From the standpoint of the likelihood of obtaining a higher-quality surface (e.g. a surface with reduced defect such as LPD, PID, etc.), the art disclosed herein can also be preferably practiced in an embodiment using an abrasive having an average secondary particle diameter $D_{P2}$ of smaller than 60 nm (more preferably 55 nm or smaller, e.g. smaller than 50 nm).

The abrasive's average secondary particle diameter $D_{P2}$ can be measured for an aqueous dispersion of the abrasive of interest as a measurement sample by dynamic light scattering using, for instance, model "UPA-UT151" available from Nikkiso Co., Ltd.

The abrasive's average secondary particle diameter $D_{P2}$ is generally equal to or larger than the abrasive's average primary particle diameter $D_{P1}$ ($D_{P2}/D_{P1} \geq 1$) and is typically larger than $D_{P1}$ ($D_{P2}/D_{P1} \geq 1$). Although not particularly limited, from the standpoint of the effects of polishing and post-polishing surface smoothness, $D_{P2}/D_{P1}$ of the abrasive is usually suitably in a range of 1.2 to 3, preferably in a range of 1.5 to 2.5, or more preferably in a range of 1.7 to 2.3 (e.g. greater than 1.9, but 2.2 or less).

The abrasive grain's shape (external shape) may be a globular shape or a non-globular shape. Specific examples of non-globular shapes of the abrasive include a peanut shape (i.e. peanut shell shape), cocoon shape, confeito shape (spiky ball shape), rugby ball shape, and so on. For instance, the abrasive mostly comprising peanut-shaped grains can be preferably used.

Although not particularly limited, the abrasive has an average value of primary particle's major axis to minor axis ratio (average aspect ratio) of preferably 1.0 or higher, more preferably 1.05 or higher, or yet more preferably 1.1 or higher. With increasing average aspect ratio of the abrasive, a higher polishing rate can be obtained. From the standpoint of scratch reduction and so on, the abrasive's average aspect ratio is preferably 3.0 or lower, more preferably 2.0 or lower, or yet more preferably 1.5 or lower.

The abrasive's shape (external shape) and average aspect ratio can be assessed, for instance by electron microscope observations. In specific procedures for determining the average aspect ratio, for instance, using a scanning electron microscope (SEM), with respect to a prescribed number (e.g. 200) of abrasive grains having observable separate shapes, the smallest circumscribing rectangles are drawn on the respective grain images. With respect to the rectangle drawn on each grain image, the long side length (major axis length) is divided by the short side length (minor axis length) to determine the major axis/minor axis ratio (aspect ratio). The aspect ratios of the prescribed number of grains can be arithmetically averaged to determine the average aspect ratio.

<Water-Soluble Polymer>

The polishing composition disclosed herein comprises a water-soluble polymer. The type of water-soluble polymer is not particularly limited. A suitable species can be selected from water-soluble polymers known in the field of polishing compositions.

The water-soluble polymer may have at least one species of functional group in the molecule, selected from cationic groups, anionic groups and nonionic groups. In the molecule, the water-soluble polymer may have, for instance, a hydroxyl group, carboxyl group, acryloxy group, sulfo group, amide structure, quaternary nitrogen structure, heterocyclic structure, vinyl structure, polyoxyalkylene structure, etc.

Examples of water-soluble polymers that can be preferably used in the polishing composition disclosed herein include vinyl alcohol-based polymers such as a polyvinyl alcohol, a derivative thereof, etc.; oxyalkylene unit-containing polymers; nitrogen atom-containing polymers; and so on.

The vinyl alcohol-based polymer is typically a polymer (PVA) comprising a vinyl alcohol unit (VA unit) as the primary repeating unit. In this polymer, the molar ratio of VA units to all the repeating units is usually 50% or higher, preferably 65% or higher, or more preferably 70% or higher, for instance, 75% or higher. All the repeating units may be essentially formed of VA units. In these vinyl alcohol-based polymers, the types of repeating unit other than the VA unit are not particularly limited. Examples may include vinyl acetate unit, vinyl propionate unit, vinyl hexanoate unit, etc.

When a vinyl alcohol-based polymer (PVA) is used as the water-soluble polymer, it has a degree of saponification of usually 50% by mole or higher, typically 65% by mole or higher, or preferably 75% by mole or higher, for instance, 80% by mole or higher. In a preferable embodiment, the degree of saponification of PVA is 90% by mole or higher. From the standpoint of the consistency of performance of the polishing composition, a PVA having a degree of saponification of 95% by mole or higher (typically higher than 95% by mole, e.g. higher than 98% by mole) is particularly preferable. The degree of saponification of PVA is theoretically 100% by mole or lower.

As the PVA, it is preferable to use a species with low metal ion content. A PVA with low metal ion content can be obtained by a method where the PVA is produced using starting materials with low metal ion contents, by a method where the produced PVA is ion-exchanged, and so on. Among metal ions, a PVA with low content of alkali metal ions is preferable. A PVA essentially free of sodium ions is particularly preferable. The use of such a PVA is advantageous also from the standpoint of reducing defect in the polished surface. For instance, can be preferably used a PVA whose sodium ion content is reduced to a level approximately equivalent to a sodium ion concentration of 10 ppb or lower in the polishing liquid (working slurry) described later.

The oxyalkylene unit-containing polymer may comprise one, two or more species of oxyalkylene unit with 2 to 6 carbon atoms (typically, a structural unit represented by —$C_nH_{2n}O$— wherein n is an integer between 2 and 6). The number of carbon atoms in the oxyalkylene unit is preferably 2 to 3. Examples of such a polymer include a polyethylene oxide (PEO), a block copolymer of ethylene oxide (EO) and propylene oxide (PO), a random copolymer of EO and PO, and the like.

The block copolymer of EO and PO can be a diblock copolymer, triblock copolymer or the like comprising a polyethylene oxide (PEO) block and a polypropylene oxide (PPO) block. Examples of the triblock include a PEO-PPO-PEO triblock copolymer and PPO-PEO-PPO triblock copolymer. Usually, a PEO-PPO-PEO triblock copolymer is more preferable.

As the PEO-PPO-PEO triblock copolymer, a polymer represented by the following general formula (1) can be preferably used:

$$\text{HO-(EO)}_a\text{-(PO)}_b\text{-(EO)}_c\text{-H} \qquad (1)$$

In the general formula (1), EO represents an oxyethylene unit (—$CH_2CH_2O$—), PO represents an oxypropylene unit (—$CH_2CH(CH_3)O$—), and each of a, b and c is an integer of 1 or higher (typically 2 or higher).

In the general formula (1), the total of a and c is preferably in a range of 2 to 1000, more preferably in a range of 5 to 500, or yet more preferably in a range of 10 to 200. In the general formula (1), b is preferably in a range of 2 to 200, more preferably in a range of 5 to 100, or yet more preferably in a range of 10 to 50.

In the block copolymer or random copolymer of EO and PO, from the standpoint of the water solubility and washability, etc., the molar ratio (EO/PO) between EO and PO constituting the copolymer is preferably higher than 1, more preferably 2 or higher, or yet more preferably 3 or higher (e.g. 5 or higher).

As the nitrogen atom-containing polymer, either a polymer containing nitrogen atoms in the main chain or a polymer having a nitrogen atom in the side chain functional group (pendant group) can be used.

Examples of the polymer having a nitrogen atom in the main chain include a homopolymer and a copolymer of an N-acylalkyleneimine-based monomer. Specific examples of the N-acylalkyleneimine-based monomer include N-acetylethyleneimine, N-propionylethyleneimine, N-caproylethyleneimine, N-benzoylethyleneimine, N-acetylpropyleneimine, N-butyrylethyleneimine, etc. The homopolymer of N-acylalkyleneimine-based monomer include poly(N-acetylethyleneimine), poly(N-propionylethyleneimine), poly(N-caproylethyleneimine), poly(N-benzoylethyleneimine), poly(N-acetylpropyleneimine), poly(N-butyrylethyleneimine), etc. Examples of the copolymer of the N-acylalkyleneimine-based monomer include a copolymer of two or more species of N-acylalkyleneimine-based monomer and a copolymer of one, two or more species of N-acylalkyleneimine-based monomer and other monomer(s).

Unless otherwise indicated, the copolymer in this specification comprehensively means various copolymers such as random copolymer, alternating copolymer, block copolymer, graft copolymer, etc.

Examples of a polymer having a nitrogen atom in an pendant group include a polymer comprising an N-(meth)acryloyl monomeric unit, a polymer comprising an N-vinyl monomeric unit, etc. The term "(meth)acryloyl" herein comprehensively refers to acryloyl and methacryloyl.

Examples of the N-(meth)acryloyl monomeric unit-containing polymer include a homopolymer of an N-(meth) acryloyl-based monomer and a copolymer thereof (typically a copolymer in which the copolymerization ratio of N-(meth)acryloyl-based monomer exceeds 50% by mass). Examples of the N-(meth)acryloyl-based monomer include an open-chain amide having an N-(meth)acryloyl group and a cyclic amide having an N-(meth)acryloyl group.

Examples of an open-chain amide having an N-(meth) acryloyl group include: acrylamide; N-monoalkylacrylamides such as N-methylacrylamide, N-ethylacrylamide, N-propylacrylamide, N-isopropylacrylamide, N-butylacrylamide, N-isobutylacrylamide, N-tert-butylacrylamide, N-heptylacrylamide, N-octylacrylamide, N-tert-octylacrylamide, N-dodecylacrylamide, N-octadecylacrylamide, etc.; substituted N-monoalkylacrylamides such as N-(2-hydroxyethyl)acrylamide, N-(1,1-dimethyl-2-hydroxyethyl)acrylamide, N-(1-ethyl-hydroxyethyl)acrylamide, N-(2-chloroethyl)acrylamide, N-(2,2,2-trichloro-1-hydroxyethyl) acrylamide, N-(2-dimethylaminoethyl)acrylamide, N-(3-dimethylaminopropyl)acrylamide, N-[3-bis(2-hydroxyethyl)aminopropyl]acrylamide, N-(1,1-dimethyl-2-dimethylaminoethyl)acrylamide, N-(2-methyl-2-phenyl-3-dimethylaminopropyl)acrylamide, N-(2,2-dimethyl-3-dimethylaminopropyl)acrylamide, N-(2-morpholinoethyl) acrylamide, N-(2-amino-1,2-dicyanoethyl)acrylamide, etc.; N-monoalkenylacrylamides such as N-allylacrylamide, etc.; N-monoalkynylacrylamides such as N-(1,1-dimethylpropynyl)acrylamide, etc.; aromatic group-containing acrylamides such as N-phenylacrylamide, N-benzylacrylamide, N-[4-(phenylamino)phenyl]acrylamide, etc.; N-monoalkylolacrylamides such as N-methylolacrylamide, N-ethylolacrylamide, N-propylolacrylamide, etc.; N-alkoxyalkylacrylamides such as N-methoxymethylacrylamide, N-ethoxymethylacrylamide, N-butoxymethylacrylamide, N-isobutoxymethylacrylamide, etc.; N-alkoxyacrylamides such as N-methoxyacrylamide, N-ethoxyacrylamide, N-propoxyacrylamide, N-butoxyacrylamide, etc.; N-acetylacrylamide; N-diacetoneacrylamide; methacrylamide; N-monoalkylmethacrylamides such as N-methylmethacrylamide, N-ethylmethacrylamide, N-propylmethacrylamide, N-isopropylmethacrylamide, N-butylmethacrylamide, N-isobutylmethacrylamide, N-tert-butylmethacrylamide, N-heptylmethacrylamide, N-octylmethacrylamide, N-tert-octylmethacrylamide, N-dodecylmethacrylamide, N-octadecylmethacrylamide, etc.; substituted N-monoalkylmethacrylamides such as N-(2-hydroxyethyl)methacrylamide, N-(1,1-dimethyl-2-hydroxyethyl)methacrylamide, N-(1-ethylhydroxyethyl)methacrylamide, N-(2-chloroethyl) methacrylamide, N-(2,2,2-trichloro-1-hydroxyethyl) methacrylamide, N-(2-dimethylaminoethyl) methacrylamide, N-(3-dimethylaminopropyl) methacrylamide, N-[3-bis(2-hydroxyethyl)aminopropyl] methacrylamide, N-(1,1-dimethyl-2-dimethylaminoethyl) methacrylamide, N-(2-methyl-2-phenyl-3-dimethylaminopropyl)methacrylamide, N-(2,2-dimethyl-3-dimethylaminopropyl)methacrylamide, N-(2-morpholinoethyl)methacrylamide, N-(2-amino-1,2-dicyanoethyl)methacrylamide, etc.; N-monoalkenylmethacrylamides such as N-allylmethacrylamide, etc.; N-monoalkynylmethacrylamides such as N-(1, 1-dimethylpropynyl)methacrylamide, etc.; aromatic group-containing methacrylamides such as N-phenylmethacrylamide, N-benzylmethacrylamide, N-[4-(phenylamino)phenyl]methacrylamide, etc.; N-monoalkylolmethacrylamides such as N-methylolmethacrylamide, N-ethylolmethacrylamide, N-propylolmethacrylamide, etc.; N-alkoxyalkylmethacrylamides such as N-methoxymethylmethacrylamide, N-ethoxymethylmethacrylamide, N-butoxymethylmethacrylamide, N-isobutoxymethylmethacrylamide, etc.; N-alkoxymethacrylamides such as N-methoxymethacrylamide, N-ethoxymethacrylamide, N-propoxymethacrylamide, N-butoxymethacrylamide, etc.; N-acetylmethacrylamide; N-diacetonemethacrylamide; N,N-dialkylacrylamides such as N,N-dimethylacrylamide, N,N-diethylacrylamide, N,N-dipropylacrylamide, N,N-diisopropylacrylamide, N,N-dibutylacrylamide, N,N-diisobutylacrylamide, N,N-di-tert-butylacrylamide, N,N-diheptylacrylamide, N,N-dioctylacrylamide, N,N-di-tert-octylacrylamide, N,N-didodecylacrylamide, N,N-dioctadecylacrylamide, etc.; N,N-dialkylaminoalkylacrylamides such as N,N-dimethylaminoethylacrylamide, N,N-diethylaminoethylacrylamide, N,N-dimethylaminopropylacrylamide, N,N-diethylaminopropylacrylamide, etc.; substituted N,N-dialkylacrylamides such as N,N-bis(2-hydroxyethyl)acrylamide, N,N-bis(2-cyanoethyl)acrylamide, etc.; N,N-dialkenylacrylamide such as N,N-diallylacrylamide, etc.; aromatic group-containing acrylamides such as N,N-diphenylacrylamide, N,N-dibenzylacrylamide, etc.; N,N-dialkylolacrylamides such as N,N-dimethylolacrylamide, N,N-diethylolacrylamide, N,N-dipropylolacrylamide, etc.; N-alkoxy-N-alkylacrylamides such as N-methyl-N-methoxyacrylamide, N-methyl-N-ethoxyacrylamide, N-methyl-N-propoxyacrylamide, N-methyl-N-butoxyacrylamide, N-ethyl-N-methoxyacrylamide, N-ethyl-N-ethoxyacrylamide, N-ethyl-N-butoxyacrylamide, N-propyl-N-methoxyacrylamide, N-propyl-N-ethoxyacrylamide, N-butyl-N-methoxyacrylamide, N-butyl-N-ethoxyacrylamide, etc.; N,N-diacetylacrylamide; N,N-diacetoneacrylamide; N,N-dialkylmethacrylamides such as N,N-dimethylmethacrylamide, N,N-diethylmethacrylamide, N,N-dipropylmethacrylamide, N,N-diisopropylmethacrylamide, N,N-dibutylmethacrylamide, N,N-diisobutylmethacrylamide, N,N-di-tert-butylmethacrylamide, N,N-diheptylmethacrylamide, N,N-dioctylmethacrylamide, N,N-di-tert-octylmethacrylamide, N,N-didodecylmethacrylamide, N,N-dioctadecylmethacrylamide, etc.; N,N-dialkylaminoalkylmethacrylamides such as N,N-dimethylaminoethylmethacrylamide, N,N-diethylaminoethylmethacrylamide, N,N-dimethylaminopropylmethacrylamide, N,N-diethylaminopropylmethacrylamide, etc.; substituted N,N-dialkylmethacrylamides such as N,N-bis(2-hydroxyethyl)methacrylamide, N,N-bis(2-cyanoethyl)methacrylamide, etc.; N,N-dialkenylmethacrylamides such as N,N-diallylmethacrylamide, etc.; aromatic group-containing methacrylamides such as N,N-diphenylmethacrylamide, N,N-dibenzylmethacrylamide, etc.; N,N-dialkylolmethacrylamides such as N,N-dimethylolmethacrylamide, N,N-diethylolmethacrylamide, N,N-dipropylolmethacrylamide, etc.; N-alkoxy-N-alkylmethacrylamides such as N-methyl-N-methoxymethacrylamide, N-methyl-N-ethoxymethacrylamide, N-methyl-N-propoxymethacrylamide, N-methyl-N-butoxymethacrylamide, N-ethyl-N-methoxymethacrylamide, N-ethyl-N-ethoxymethacrylamide, N-ethyl-N-butoxymethacrylamide, N-propyl-N-methoxymethacrylamide, N-propyl-N-ethoxymethacrylamide, N-butyl-N-methoxymethacrylamide, N-butyl-N-ethoxymethacrylamide, etc.; N,N-diacetylmethacrylamide; N,N-diacetonemethacrylamide; and the like.

Examples of a polymer comprising a N-(meth)acryloyl group-containing open-chain amide as a monomeric unit include a homopolymer of N-isopropylacrylamide and a copolymer of N-isopropylacrylamide (e.g. a copolymer in which the copolymerization ratio of N-isopropylacrylamide exceeds 50% by mass), homopolymer of N-hydroxyethylacrylamide and a copolymer of N-hydroxyethylacrylamide (e.g. a copolymer in which the copolymerization ratio of N-hydroxyethylacrylamide exceeds 50% by mass) and the like.

Examples of the N-(meth)acryloyl group-containing cyclic amide include N-acryloylmorpholine, N-acryloylthiomorpholine, N-acryloylpiperidine, N-acryloylpyrrolidine, N-methacryloylmorpholine, N-methacryloylpiperidine, N-methacryloylpyrrolidine, etc. An example comprising an N-(meth)acryloyl group-containing a cyclic amide as a monomeric unit is an acryloylmorpholine-based polymer (PACMO). Typical examples of the acryloylmorpholine-based polymer include a homopolymer of N-acryloylmorpholine (ACMO) and a copolymer of ACMO (e.g. a copolymer in which the copolymerization ratio of ACMO exceeds 50% by mass). In the acryloylmorpholine-based polymer, the molar ratio of ACMO units to all the repeating units is usually 50% or higher and suitably 80% or higher (e.g. 90% or higher, typically 95% or higher). Essentially all the repeating units in the water-soluble polymer may be formed of ACMO units.

Examples of the N-vinyl monomeric unit-containing polymer include a homopolymer of an N-vinyllactam-based monomer and a copolymer thereof (e.g. a copolymer in which the copolymerization ratio of the N-vinyllactam-based monomer exceeds 50% by weight), a homopolymer of an open-chain N-vinylamide and a copolymer thereof (e.g. a copolymer in which the copolymerization ratio of the open-chain N-vinylamide exceeds 50% by weight) and the like.

Specific examples of the N-vinyllactam-based monomer include N-vinylpyrrolidone (VP), N-vinylpiperidone, N-vinylmorpholinone, N-vinylcaprolactam (VC), N-vinyl-1,3-oxazine-2-one, N-vinyl-3,5-morpholinedione, etc. Specific examples of the N-vinyllactam monomeric unit-containing polymer include a polyvinylpyrrolidone (PVP), polyvinylcaprolactam, random copolymer of VP and VC, random copolymer of one or each of VP and VC with another vinyl monomer (e.g. acrylic monomer, vinyl ester-based monomer, etc.), block copolymer and graft copolymer comprising a polymer segment with one or each of VP and VC (e.g. a graft copolymer obtained by grafting polyvinyl alcohol with polyvinylpyrrolidone), and the like. A particularly preferable species is a vinylpyrrolidone-based polymer (PVP). Herein the vinylpyrrolidone-based polymer refers to a VP homopolymer and a VP copolymer (e.g. a copolymer in which the copolymerization ratio of VP exceeds 50% by weight). In the vinylpyrrolidone-based polymer, the molar ratio of VP unit to all the repeating units is usually 50% or higher and suitably 80% or higher (e.g. 90% or higher, typically 95% or higher). Essentially all the repeating units in the water-soluble polymer may be formed with VP units.

Specific examples of the open-chain N-vinylamide include N-vinylacetamide, N-vinylpropionic acid amide, N-vinyllactic acid amide, etc.

Specific examples of the open-chain N-vinylamide include N-vinylacetamide, N-vinylpropionic acid amide, N-vinyllactic acid amide, etc.

Other examples of a polymer having a nitrogen atom in a pendant group include a homopolymer and a copolymer of an amino group-containing vinyl monomer (e.g. a monomer having a (meth)acryloyl group) such as aminoethyl (meth)acrylate, N,N-dimethylaminoethyl (meth)acrylate, N,N-dimethylaminopropyl (meth)acrylate, etc.

Other examples of the water-soluble polymer that can be contained in the polishing composition disclosed herein include cellulose derivatives such as hydroxyethyl cellulose, hydroxypropyl cellulose, hydroxyethylmethyl cellulose, hydroxypropylmethyl cellulose, methyl cellulose, ethyl cellulose, ethylhydroxyethyl cellulose, carboxymethyl cellulose, etc.; and pullulan.

The molecular weight of the water-soluble polymer in the polishing composition disclosed herein is not particularly limited. For instance, a water-soluble polymer having a weight average molecular weight (Mw) of $200 \times 10^4$ or smaller (typically $1 \times 10^3$ to $200 \times 10^4$, e.g. $1 \times 10^3$ to $150 \times 10^4$) can be used. From the standpoint of better preventing formation of aggregates, the use of a water-soluble polymer having a Mw of smaller than $100 \times 10^4$ (more preferably $80 \times 10^4$ or smaller, yet more preferably $50 \times 10^4$ or smaller, typically $40 \times 10^4$ or smaller, e.g. $30 \times 10^4$ or smaller) is preferable. From the standpoint of the ease of filtering and washing the polishing composition, etc., a water-soluble polymer having a Mw of $25 \times 10^4$ or smaller (typically $20 \times 10^4$ or smaller, more preferably $15 \times 10^4$ or smaller, e.g. $10 \times 10^4$ or smaller) can be preferably used. On the other hand, in general, with increasing Mw of water-soluble polymer, the haze reduction effect tends to increase. From such a standpoint, it is usually suitable to use a water-soluble polymer having a Mw of $1 \times 10^3$ or larger. For instance, a water-soluble polymer having a Mw of $1 \times 10^4$ or larger can be preferably used.

More preferable Mw ranges may also vary depending on the type of water-soluble polymer. For instance, the Mw of the vinyl alcohol-based polymer (PVA) as the water-soluble polymer is typically $30 \times 10^4$ or smaller, preferably $25 \times 10^4$ or smaller, more preferably $20 \times 10^4$ or smaller, yet more preferably $10 \times 10^4$ or smaller (e.g. $5 \times 10^4$ or smaller, or even $2 \times 10^4$ or smaller). The Mw of PVA is typically $1 \times 10^3$ or larger, preferably $2 \times 10^3$ or larger, for instance, $3 \times 10^3$ or larger. A PVA having a Mw of $1 \times 10^4$ or larger can be used as well.

The Mw of the oxyalkylene unit-containing water-soluble polymer is preferably $50 \times 10^4$ or smaller, more preferably $30 \times 10^4$ or smaller, yet more preferably $25 \times 10^4$ or smaller (e.g. $10 \times 10^4$ or smaller). The Mw of the oxyalkylene unit-containing water-soluble polymer is typically $1 \times 10^4$ or larger.

For instance, the Mw of the nitrogen atom-containing water-soluble polymer is typically $50 \times 10^4$ or smaller, preferably $40 \times 10^4$ or smaller, more preferably $30 \times 10^4$ or smaller, yet more preferably $10 \times 10^4$ or smaller (e.g. $7 \times 10^4$ or smaller). The lower limit of Mw of the nitrogen atom-containing water-soluble polymer is not particularly limited. The Mw of the nitrogen atom-containing water-soluble polymer is, for instance, $1 \times 10^3$ or larger, typically $1 \times 10^4$ or larger. From the standpoint of haze reduction, etc., it is preferably $2 \times 10^4$ or larger, or more preferably $3 \times 10^4$ or larger.

While no particular limitations are imposed, among the nitrogen atom-containing water-soluble polymers, as the polymer comprising an N-(meth)acryloyl group-containing open-chain amide as a monomeric unit, a species with a relatively small Mw can be preferably used. For instance, from the standpoint of reducing surface defect such as LPD, etc., the polymer has a Mw of advantageously smaller than $5 \times 10^4$, preferably $4 \times 10^4$ or smaller, or more preferably $3 \times 10^4$ or smaller. In a preferable embodiment, as the polymer, a species having a Mw of $1 \times 10^4$ or smaller can be used as well. The lower limit of Mw of the polymer is not particularly limited. It is usually $1 \times 10^3$ or larger, preferably $2 \times 10^3$ or larger, or more preferably $3 \times 10^3$ or larger.

While no particular limitations are imposed, from the standpoint of reduction of haze and surface defect, etc., among the nitrogen atom-containing water-soluble polymers, with respect to the polymer comprising an N-(meth)acryloyl group-containing cyclic amide (e.g. N-acryloylmorpholine) as a monomeric unit, the Mw is preferably $40 \times 10^4$ or smaller, more preferably $20 \times 10^4$ or smaller, or yet more preferably $10 \times 10^4$ or smaller. The lower limit of Mw of the polymer is not particularly limited. From the standpoint of haze reduction, the polymer has a Mw of advantageously $1 \times 10^3$ or larger, preferably $1 \times 10^4$ or larger, or more preferably $2 \times 10^4$ or larger. From the standpoint of reduction of surface defect, the Mw is advantageously $1 \times 10^3$ or larger, preferably $5 \times 10^4$ or larger, or more preferably $10 \times 10^4$ or larger. From the standpoint of reducing the lowering of polishing rate to improve the surface quality, the Mw of the polymer is preferably $1 \times 10^3$ or larger, but $40 \times 10^4$ or smaller, more preferably $1 \times 10^4$ or larger, but $40 \times 10^4$ or smaller, or yet more preferably $20 \times 10^4$ or larger, but $40 \times 10^4$ or smaller (e.g. $30 \times 10^4$ or larger, but $40 \times 10^4$ or smaller).

In the art disclosed herein, the relationship between the weight average molecular weight (Mw) and number average molecular weight (Mn) of the water-soluble polymer is not particularly limited. From the standpoint of preventing aggregate formation, etc., for instance, a water-soluble polymer having a molecular weight distribution (Mw/Mn) of 5.0 or lower can be preferably used. From the standpoint of the consistency of performance of the polishing composition, etc., the Mw/Mn of the water-soluble polymer is preferably 4.0 or lower, more preferably 3.5 or lower, or yet more preferably 3.0 or lower (e.g. 2.5 or lower).

Theoretically, the Mw/Mn is 1.0 or higher. From the standpoint of the availability of starting materials and ease of synthesis, usually, a water-soluble polymer having an Mw/Mn of 1.05 or higher can be preferably used.

As the Mw and Mn of a water-soluble polymer, the values based on aqueous gel permeation chromatography (GPC) (aqueous, based on standard polyethylene oxide) can be used.

<Adsorption Ratio>

The polishing composition disclosed herein is characterized by comprising two kinds of water-soluble polymers having different adsorption ratios in the adsorption ratio measurement described below. Specifically, the polishing composition disclosed herein comprises a polymer A having an adsorption ratio of lower than 5% and a polymer B (excluding a hydroxyethyl cellulose) having an adsorption ratio of 5% or higher, but lower than 95%. As the polymer A, water-soluble polymers satisfying the adsorption ratio can be used singly or in a combination of two or more species. Similarly, for the polymer B, water-soluble polymers satisfying the adsorption ratio can be used singly or in a combination of two or more species.

The adsorption ratios are measured as described below. More specifically, for instance, the adsorption ratios of the respective water-soluble polymers can be determined in the same manner as the adsorption ratio measurement described later in the working examples.

[Adsorption Ratio Measurement]
(1) A test solution L0 is obtained, comprising 0.018% by mass of a measured polymer and 0.01% by mass of ammonia with the rest being water.

(2) A test solution L1 is obtained, comprising 0.18% by mass of the abrasive as well as 0.018% by mass of the measured polymer and 0.01% by mass of ammonia with the rest being water.
(3) The test solution L1 is centrifuged to precipitate the abrasive.
(4) From the mass W0 of the measured polymer in the test solution L0 and mass W1 of the measured polymer in the supernatant of the centrifuged test solution L1, the adsorption ratio of the measured polymer is determined by the next equation:

Adsorption ratio (%)=[(W0−W1)/W0]×100

The centrifugation can be carried out at a rotational speed of 20000 rpm for 30 minutes, using, for instance, a centrifuge under model name "AVANTI HP-30I" available from Beckman Coulter, Inc. The mass W0 of the measured polymer in the test solution L0 and mass W1 of the measured polymer in the supernatant of the centrifuged test solution L1 can be determined by measuring the total organic carbons (TOC) in the test solution L1 and the supernatant. TOC can be measured, for instance, using a TOC analyzer (combustion catalytic oxidation method, model name "TOC-5000A") available from Shimadzu Corporation or a similar product.

As the abrasive used for adsorption ratio measurement of a polymer, it is desirable to use the same abrasive (e.g. an abrasive of the same material, particle diameters and particle shape) as the abrasive in the polishing composition containing the polymer to be measured. However, in view of practical convenience, the adsorption ratio may be measured using an abrasive different from the one used in the polishing composition as far as no large difference occurs in adsorption ratio when compared with the adsorption ratio value measured using the abrasive used in the polishing composition (e.g. as far as the adsorption ratio of the measured polymer is clearly higher or lower than 5% regardless of which abrasive is used). For instance, an abrasive made of the same material as the abrasive used in the polishing composition, but in slightly different particle size and shape (e.g. different in one, two or more characteristic values among average primary particle diameter, average secondary particle diameter, size distribution, aspect ratio, specific surface area, etc.) can be used. It is usually suitable to measure the adsorption ratio, using an abrasive made of the same type of material with approximately the same specific surface area as the abrasive used in the polishing composition (e.g. within a ±10% difference in specific surface area relative to the abrasive forming the polishing composition).

The art disclosed herein can be preferably applied to, but not particularly limited to, a polishing composition using an abrasive having a specific surface area of about 20 mm$^2$/g to 200 mm$^2$/g (typically 50 mm$^2$/g to 150 mm$^2$/g).

The polymer A in the art disclosed herein is not particularly limited as long as it is a water-soluble polymer having an adsorption ratio of lower than 5% in the adsorption ratio measurement. From the standpoint of reducing aggregates and increasing the washability, etc., a nonionic polymer can be preferably used as the polymer A.

From the standpoint of obtaining greater effect of the combined use with the polymer B (e.g. effect to improve the polishing performance as compared with the sole use of the polymer A or polymer B), the polymer A has an adsorption ratio of preferably lower than 3% or more preferably lower than 1%, or it can be essentially 0% as well.

A preferable example of the polymer A is a vinyl alcohol-based polymer (PVA). For instance, a PVA having a degree of saponification of 75% by mole or higher or preferably 80% by mole or higher can be preferably used as the polymer A. A PVA having a degree of saponification of 90% by mole or higher or more preferably 95% by mole or higher (typically higher than 95% by mole, e.g. higher than 98% by mole) can be preferably used as the polymer A. The Mw of PVA is preferably $1 \times 10^3$ or larger, or more preferably $2 \times 10^3$ or larger, for instance, $3 \times 10^3$ or larger. In a preferable embodiment, the Mw of PVA is preferably $1 \times 10^4$ or larger. The Mw of PVA is preferably $15 \times 10^4$ or smaller, more preferably $10 \times 10^4$ or smaller, or yet more preferably $5 \times 10^4$ or smaller (typically $3 \times 10^4$ or smaller).

Other preferable examples of the polymer A include an oxyalkylene unit-containing polymer that satisfies the adsorption ratio. A specific example of such a polymer is polyoxyethylene oxide. Another example is a polyalkylene oxide in which ethylene oxide and another alkylene oxide are copolymerized to an extent where the adsorption ratio is lower than 5%. The Mw of an oxyalkylene unit-containing polymer as the polymer A is preferably $1 \times 10^4$ or larger. The Mw of an oxyalkylene unit-containing polymer as the polymer A is preferably $30 \times 10^4$ or smaller, more preferably $25 \times 10^4$ or smaller, or yet more preferably $20 \times 10^4$ or smaller (e.g. $10 \times 10^4$ or smaller).

For the polymer A, solely one species or a combination of two or more species can be used. The polishing composition disclosed herein can be preferably made in an embodiment comprising at least a PVA as the polymer A (e.g. an embodiment consisting of one, two or more species of PVA as the polymer A).

The polymer B in the art disclosed herein is not particularly limited as long as it is a water-soluble polymer having an adsorption ratio of 5% or higher, but lower than 95% in the adsorption ratio measurement. From the standpoint of reducing aggregates and increasing the washability, etc., a nonionic polymer can be preferably used as the polymer B.

From the standpoint of obtaining greater effect of the combined use with the polymer A (e.g. effect to improve the polishing performance as compared with the sole use of the polymer A or polymer B), the polymer B has an adsorption ratio of preferably 8% or higher, more preferably 10% or higher, or yet more preferably 12% or higher. For the same reasons, the subtraction ($P_B - P_A$) of polymer A's adsorption ratio $P_A$ from polymer B's adsorption ratio $P_B$ is preferably 5% or greater, more preferably 7% or greater, or yet more preferably 10% or greater. When the difference in adsorption ratio between polymers A and B is excessively large, the effect of their combined use may have a tendency to decrease. From such a standpoint, in a preferable embodiment, the adsorption ratio difference ($P_B - P_A$) can be 80% or less, or more preferably 70% or less (e.g. 60% or less).

As an example of the polymer B, a species having an adsorption ratio of 5% or higher, but lower than 95% among the oxyalkylene unit-containing polymers and nitrogen atom-containing polymers can be suitably used. Preferable examples of an N-vinyl monomeric unit-containing polymer B include, but not limited to, a homopolymer and a copolymer of an N-vinyllactam-based monomer (e.g. polyvinylpyrrolidone). Preferable examples of an N-(meth)acryloyl monomeric unit-containing polymer B include a homopolymer and a copolymer of an N-alkyl(meth)acrylamide (e.g. polyisopropylacrylamide), a homopolymer and a copolymer of an N-hydroxyalkyl(meth)acrylamide (e.g. polyhydroxyethylacrylamide), and a homopolymer and a copolymer of a cyclic amide having an N-(meth)acryloyl group (e.g. polyacryloylmorpholine).

The Mw of the polymer B is preferably $1 \times 10^4$ or larger. The Mw of the polymer B is preferably $50 \times 10^4$ or smaller. From the standpoint of the ease of filtration, it is more preferably $25 \times 10^4$ or smaller, or yet more preferably $20 \times 10^4$ or smaller (e.g. $10 \times 10^4$ or smaller). From the standpoint of haze reduction, the polymer B's Mw is advantageously $1.5 \times 10^4$ or larger, preferably $2.0 \times 10^4$ or larger, more preferably $3.0 \times 10^4$ or larger, or yet more preferably $3.5 \times 10^4$ or larger.

While no particular limitations are imposed, the art disclosed herein can be preferably implemented in a range where the polymer B's Mw ($Mw_B$) and polymer A's Mw ($Mw_A$) are not numerically extremely distant from each other, specifically in an embodiment where the $Mw_B$ and $Mw_A$ are in the same order.

In the art disclosed herein, there are no particular limitations to the usage ratio of polymer A to polymer B (which can be thought as the content ratio in the polishing composition). From the standpoint of obtaining greater effect of the combined use of polymer A and polymer B, their usage ratio (A:B) is suitably 5:95 to 95:5, or preferably 10:90 to 90:10 (e.g. 20:80 to 80:20).

The polishing composition disclosed herein can be preferably made in an embodiment using solely a polymer A and a polymer B as the water-soluble polymer (typically having a Mw of $1 \times 10^3$ or larger, e.g. $1 \times 10^4$ or larger). Alternatively, it can be made in an embodiment further comprising another water-soluble polymer besides the polymer A and polymer B. In this embodiment, no particular limitations are imposed on the amount of the other water-soluble polymer (polymer C) besides the polymer A and polymer B. From the standpoint of obtaining greater effect of the combined use of polymer A and polymer B, the combined amount of polymers A and B in the total water-soluble polymer is preferably 60% by mass or greater, more preferably 75% by mass or greater, or yet more preferably 90% by mass or greater (e.g. 95% by mass or greater).

When the polishing composition disclosed herein comprises a cellulose derivative as a water-soluble polymer C, its amount used is preferably as low as or lower than 40% by mass of the total water-soluble polymer in the polishing composition while it is more preferably 25% by mass or lower, or yet more preferably 10% by mass or lower (typically 5% by mass or lower). By this, inclusion of foreign substances and aggregation caused by the use of a natural compound-derived cellulose derivative can be reduced to a greater extent. The polishing composition disclosed herein can be preferably made, for instance, in an embodiment essentially free of a cellulose derivative as the water-soluble polymer C.

Although not particularly limited, the water-soluble polymer content (the total amount of polymers A and B as well as polymer C which can be used as necessary) can be, for instance, 0.01 part by mass or higher to 100 parts by mass of the abrasive. From the standpoint of increasing the post-polishing surface smoothness (e.g. reduction of haze and defects), the water-soluble polymer content relative to 100 parts by mass of the abrasive is suitably 0.05 part by mass or higher, preferably 0.1 part by mass or higher, or more preferably 0.5 part by mass or higher (e.g. 1 part by mass or higher). From the standpoint of the polishing rate and washability, etc., the water-soluble polymer content relative to 100 parts by mass of the abrasive can be, for instance, 40 parts by mass or less, usually suitably 20 parts by mass or less, preferably 15 parts by mass or less, or more preferably 10 parts by mass or less.

<Water>

As the water in the polishing composition disclosed herein, ion-exchanged water (deionized water), pure water, ultrapure water, distilled water and the like can be preferably used. To avoid hindering the effects of other components in the polishing composition whenever possible, in the water used, for instance, the total transition metal ion content is preferably 100 ppb or less. For example, the purity of the water can be increased by operations such as removing impurity ions with ion-exchange resin, removing contaminants with a filter, distillation, and so on.

The polishing composition disclosed herein may further comprise, as necessary, a water-miscible organic solvent (lower alcohol, lower ketone, etc.). In usual, of the solvent in the polishing composition, preferably 90% by volume or more is water, or more preferably 95% by volume or more (typically 99 to 100% by volume) is water.

The polishing composition disclosed herein (typically a slurry composition) can be preferably made, for instance, in an embodiment in which the non-volatile content (NV) is 0.01% by mass to 50% by mass and the rest is an aqueous solvent (water or a mixture of water and the organic solvent) or in an embodiment where the rest is an aqueous solvent and a volatile compound (e.g. ammonia). An embodiment wherein the NV is 0.05% to 40% by mass is more preferable. The non-volatile content (NV) refers to the mass proportion of residue remaining in the polishing composition after drying the polishing composition at 105° C. for 24 hours.

<Basic Compound>

The polishing compound disclosed herein typically comprises a basic compound besides the abrasive, water-soluble polymer and water. Herein, the basic compound refers to a compound having an ability to increase the pH of a polishing composition upon addition to the composition. The basic compound may work to chemically polish the target surface and contribute to increase the polishing rate. The basic compound may also help increase the dispersion stability of the polishing composition.

As the basic compound, organic or inorganic nitrogen-containing basic compounds, hydroxides of alkali metals or alkaline earth metals, various carbonates and hydrogen carbonates, etc., can be used. Examples include alkali metal hydroxides; quaternary ammonium hydroxides and salts thereof; ammonia; amines; and the like. Specific examples of alkali metal hydroxides include potassium hydroxide, sodium hydroxide, etc. Specific examples of carbonates and hydrogen carbonates include ammonium hydrogen carbonate, ammonium carbonate, potassium hydrogen carbonate, potassium carbonate, sodium hydrogen carbonate, sodium carbonate, etc. Specific examples of quaternary ammonium hydroxides or salts thereof include such as tetramethylammonium hydroxide, tetraethylammonium hydroxide, tetrabutylammonium hydroxide, etc. Specific examples of amines include methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetramine, anhydrous piperazine, piperazine hexahydrate, 1-(2-aminoethyl)piperazine, N-methylpiperazine, guanidine, azoles such as imidazole, triazole, etc., and the like. These basic compounds can be used singly as one species or in a combination of two or more species.

Examples of basic compounds preferable from the standpoint of increasing the polishing rate, etc., include ammonia, potassium hydroxide, sodium hydroxide, tetramethylammonium hydroxide, tetraethylammonium hydroxide, ammonium hydrogen carbonate, ammonium carbonate, potassium hydrogen carbonate, potassium carbonate, sodium hydrogen carbonate and sodium carbonate. In particular, preferable examples include ammonia, potassium hydroxide, sodium hydroxide, tetramethylammonium hydroxide and tetraethylammonium hydroxide. As more preferable species, ammonia and tetramethylammonium hydroxide are cited. An especially preferable basic compound is ammonia.
<Surfactant>

The polishing composition disclosed herein can be preferably made in an embodiment comprising a surfactant (typically a water-soluble organic compound having a molecular weight below $1\times10^4$) besides the abrasive, water-soluble polymer and water. The use of surfactant may increase the dispersion stability of the polishing composition. It may facilitate the reduction of haze. For the surfactant, solely one species or a combination of two or more species can be used.

As the surfactant, anionic or nonionic kinds can be preferably used. From the standpoint of the low-foaming properties and easy pH adjustment, nonionic surfactants are more preferable. Examples include oxyalkylene polymers such as polyethylene glycol, polypropylene glycol, polytetramethylene glycol, etc.; polyoxyalkylene adducts such as polyoxyethylene alkyl ether, polyoxyethylene alkyl phenyl ether, polyoxyethylene alkylamine, polyoxyethylene fatty acid ester, polyoxyethylene glyceryl ether fatty acid ester, polyoxyethylene sorbitan fatty acid ester, etc.; copolymers (diblock copolymer, triblock copolymer, random-type copolymer, alternating-type copolymer) of several species of oxyalkylene; and the like.

Specific examples of nonionic surfactant include a block copolymer of EO and PO (diblock copolymer, PEO-PPO-PEO triblock copolymer, PPO-PEO-PPO triblock copolymer, etc.), a random copolymer of EO and PO, polyoxyethylene glycol, polyoxyethylene propyl ether, polyoxyethylene butyl ether, polyoxyethylene pentyl ether, polyoxyethylene hexyl ether, polyoxyethylene octyl ether, polyoxyethylene 2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, polyoxyethylene oleyl ether, polyoxyethylene phenyl ether, polyoxyethylene octyl phenyl ether, polyoxyethylene nonyl phenyl ether, polyoxyethylene dodecyl phenyl ether, polyoxyethylene styrenated phenyl ether, polyoxyethylene laurylamine, polyoxyethylene stearylamine, polyoxyethylene oleylamine, polyoxyethylene stearylamide, polyoxyethylene oleylamide, polyoxyethylene monolaurate, polyoxyethylene monostearate, polyoxyethylene distearate, polyoxyethylene monooleate, polyoxyethylene dioleate, polyoxyethylene sorbitan monolaurate, polyoxyethylene sorbitan monopalmitate, polyoxyethylene sorbitan monostearate, polyoxyethylene sorbitan monooleate, polyoxyethylenesorbitan trioleate, polyoxyethylene sorbitol tetraoleate, polyoxyethylene castor oil, polyoxyethylene hardened castor oil, and the like. Particularly preferable surfactants include a block copolymer of EO and PO (especially a PEO-PPO-PEO triblock copolymer), a random copolymer of EO and PO, and polyoxyethylene alkyl ether (e.g. polyoxyethylene decyl ether).

The surfactant typically has a molecular weight below $1\times10^4$. From the standpoint of the ease of filtering the polishing composition and washing the polished article, it is preferably 9500 or smaller. The molecular weight of the surfactant is typically 200 or larger. From the standpoint of haze reduction effect, etc., it is preferably 250 or larger, or more preferably 300 or larger (e.g. 500 or larger). As the molecular weight of the surfactant, the weight average molecular weight (Mw) determined by GPC (aqueous, based on standard polyethylene glycol) or the molecular weight determined from the chemical formula can be used.

More preferable molecular weight ranges of the surfactant may also vary depending on the type of surfactant. For instance, when a block copolymer of EO and PO is used as the surfactant, its Mw is preferably 1000 or larger, more preferably 2000 or larger, or yet more preferably 5000 or larger.

As the surfactant in the art disclosed herein, it is also possible to use a species having a similar chemical structure as an aforementioned water-soluble polymer while having a Mw below $1\times10^4$. Thus, for instance, when a polyvinyl alcohol is used as the water-soluble polymer A, the polishing composition disclosed herein can be made in an embodiment using a polyvinyl alcohol with a Mw of $1\times10^4$ or larger as a water-soluble polymer A in combination with a polyvinyl alcohol with a Mw below $1\times10^4$ as a surfactant, and further comprising a water-soluble polymer B with a Mw of $1\times10^4$ or larger.

When the polishing composition disclosed herein comprises a surfactant, its content is not particularly limited as far as the effects of the present invention are not significantly impaired. Usually, from the standpoint of the washability, etc., the surfactant content relative to 100 parts by mass of the abrasive is suitably 20 parts by mass or less, preferably 15 parts by mass or less, or more preferably 10 parts by mass or less (e.g. 6 parts by mass or less). From the standpoint of obtaining greater effects of using the surfactant, the surfactant content relative to 100 parts by mass of the abrasive is suitably 0.001 part by mass or greater, preferably 0.005 part by mass or greater, or more preferably 0.01 part by mass or greater (e.g. 0.05 part by mass or greater, typically 0.1 part by mass or greater).

The mass ratio (W1/W2) of water-soluble polymer content W1 to surfactant content W2 is not particularly limited. Usually, it is suitably in a range of 0.01 to 200, or preferably, for instance, in a range of 0.1 to 100. In a preferable embodiment, W1/W2 can be, for instance, in a range of 0.01 to 20, preferably in a range of 0.05 to 15, or more preferably in a range of 0.1 to 10.
<Other Components>

As far as the effects by the present invention are not significantly hindered, the polishing composition disclosed herein may further comprise as necessary known additives, such as chelating agents, organic acids, organic acid salts, inorganic acids, inorganic acid salts, preservatives, antifungal agents, and so on, which can be used in polishing compositions (typically, polishing compositions used for final polishing of silicon wafers).

Examples of chelating agents include aminocarboxylic acid-based chelating agents and organophosphonic acid-based chelating agents. Examples of aminocarboxylic acid-based chelating agents include ethylenediamine tetraacetic acid, ethylenediamine tetraacetic acid sodium salt, nitrilotriacetic acid, nitrilotriacetic acid sodium salt, nitrilotriacetic acid ammonium salt, hydroxyethylethylenedimaine triacetic acid, hydroxyethylethylenediamine triacetic acid sodium salt, diethylenetriamine pentaacetic acid, diethylenetriamine pentaacetic acid sodium salt, triethylenetetramine hexaacetic acid, and triethylenetetramine hexaacetic acid sodium salt. Examples of organophosphonic acid-based chelating agents include 2-aminoethylphosphonic acid, 1-hydroxyethylidene-1,1-diphosphonic acid, aminotri (methylenephosphonic acid), ethylenediaminetetrakis(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, and α-methylphosphonosuccinic acid. Among them, organophosphonic acid-based chelating agents are preferable, with ethylenediaminetetrakis(methylenephosphonic acid) and diethylenetriaminepenta(methylenephosphonic acid) being more preferable. A particularly preferable chelating agent is ethylenediaminetetrakis(methylenephosphonic acid).

Examples of organic acids include aliphatic acids such as formic acid, acetic acid, propionic acid, etc.; aromatic carboxylic acids such as benzoic acid, phthalic acid, etc.; as well as citric acid, oxalic acid, tartaric acid, malic acid, maleic acid, fumaric acid, succinic acid, organic sulfonic acids, organic phosphoric acids, and the like. Examples of organic acid salts include alkali metal salts (sodium salts, potassium salts, etc), ammonium salts and the like of organic acids. Examples of inorganic acids include sulfuric acid, nitric acid, hydrochloric acid, carbonic acid, etc. Examples of inorganic acid salts include alkali metal salts (sodium salts, potassium salts, etc.) and ammonium salts of inorganic acids. The organic acids and their salts as well as inorganic acids and their salts can be used singly as one species or in a combination of two or more species.

Examples of preservatives and antifungal agents include isothiazoline-based compounds, paraoxybenzoic acid esters, phynoxyethanol, etc.

<Applications>

The polishing composition disclosed herein can be suitably applied for polishing objects of various materials and shapes. The polishing object's material can be, for instance, a metal or metalloid such as silicon, aluminum, nickel, tungsten, copper, tantalum, titanium, stainless steel, etc., or an alloy of these; a glassy material such as quartz glass, aluminosilicate glass, glassy carbon, etc.; a ceramic material such as alumina, silica, sapphire, silicon nitride, tantalum nitride, titanium carbide, etc.; a material for compound semiconductor substrates such as silicon carbide, gallium nitride, gallium arsenide, etc.; a resin material such as polyimide resin, etc.; or the like. The polishing object may be formed of several materials among them. In particular, it is suitable for polishing a polishing object having a surface formed of silicon. The art disclosed herein can be particularly preferably applied to a polishing composition comprising silica grains (typically consisting of silica grains) as the abrasive and intended for polishing silicon.

The shape of the polishing object is not particularly limited. The polishing composition disclosed herein can be preferably applied for polishing a polishing object having a flat surface such as a plate, polyhedron, etc.

The polishing composition disclosed herein can be preferably used for final polishing of a polishing object. Accordingly, this specification provides a polished article production method (e.g. silicon wafer production method) comprising a final polishing step using the polishing composition. The final polishing refers to the last polishing step (i.e. a step after which no further polishing is performed) in a production process of a polishing object of interest. The polishing composition disclosed herein may be used in an earlier polishing step than final polishing (referring to a step between the rough polishing step and final polishing step, typically including at least a first polishing step and possibly second, third . . . polishing steps), for instance, in a polishing step performed just before final polishing.

The polishing composition disclosed herein can be particularly preferably used for polishing a silicon wafer. For instance, it is preferable as a polishing composition used in final polishing of a silicon wafer or in an earlier polishing step than this. For instance, it is effectively applied for polishing (typically final polishing or polishing just before this) of a silicon wafer prepared into a surface state having a surface roughness of 0.01 nm to 100 nm in an earlier step. It is particularly preferably applied to final polishing.

<Polishing Liquid>

The polishing composition disclosed herein is supplied to a polishing object, typically in a form of a polishing liquid comprising the polishing composition, and used for polishing the polishing object. The polishing liquid may be prepared, for instance, by diluting (typically with water) a polishing composition disclosed herein. Alternatively, the polishing composition can be used straight as a polishing liquid. In other words, the concept of polishing composition in the art disclosed herein encompasses both a polishing liquid (working slurry) supplied to a polishing object and used for polishing the polishing object and a concentrate (stock solution of polishing liquid) which is diluted for use as a polishing liquid. Other examples of the polishing liquid comprising the polishing composition disclosed herein include a polishing liquid obtained by adjusting the pH of the composition.

The abrasive content in the polishing liquid is not particularly limited. It is typically 0.01% by mass or higher, preferably 0.05% by mass or higher, or more preferably 0.1% by mass or higher, for instance, 0.15% by mass or higher. With increasing abrasive content, a higher polishing rate can be obtained. From the standpoint of obtaining a surface with lower haze, usually, the abrasive content is suitably 10% by mass or lower, preferably 7% by mass or lower, more preferably 5% by mass or lower, or yet more preferably 2% by mass or lower, for instance, 1% by mass or lower.

The water-soluble polymer content in the polishing liquid is not particularly limited. For instance, it can be $1 \times 10^{-4}\%$ by mass or higher. From the standpoint of haze reduction, etc., the polymer content is preferably $5 \times 10^{-4}\%$ by mass or higher, or more preferably $1 \times 10^{-3}\%$ by mass or higher, for instance, $2 \times 10^{-3}\%$ by mass or higher. From the standpoint of the polishing rate, etc., the polymer content is preferably 0.2% by mass or lower, or more preferably 0.1% by mass or lower (e.g. 0.05% by mass or lower).

When a surfactant is used, the surfactant content in the polishing liquid is not particularly limited. It is usually suitable that the surfactant content is $1 \times 10^{-5}\%$ by mass or higher (e.g. $1 \times 10^{-4}\%$ by mass or higher). From the standpoint of haze reduction, etc., a preferable surfactant content is $5 \times 10^{-5}\%$ by mass or higher (e.g. $5 \times 10^{-4}\%$ by mass or higher), or more preferably $1 \times 10^{-3}\%$ by mass or higher, for instance, $2 \times 10^{-3}\%$ by mass or higher. From the standpoint of the washability, polishing rate, etc., the surfactant content is preferably 0.2% by mass or lower, or more preferably 0.1% by mass or lower (e.g. 0.05% by mass or lower).

When a basic compound is used, the basic compound content in the polishing liquid is not particularly limited. From the standpoint of increasing the polishing rate, etc., usually, the basic compound content is preferably 0.001% by mass or more of the polishing liquid, or more preferably 0.005% by mass or more. From the standpoint of haze reduction, etc., the basic compound content is preferably below 0.4% by mass, or more preferably below 0.25% by mass.

The pH of the polishing liquid is not particularly limited. For instance, the pH is preferably 8.0 to 12.0, or more preferably 9.0 to 11.0. It is preferable that the basic compound is contained to yield such a pH of the polishing liquid. The above-described pH can be preferably applied to a polishing liquid (e.g. polishing liquid for final polishing) used for polishing a silicon wafer.

<Preparation of Polishing Composition>

The method for producing the polishing composition disclosed herein is not particularly limited. For instance, the respective components of the polishing composition can be mixed, using a commonly known mixing device such as a propeller stirrer, ultrasonic disperser, homo mixer, etc. The way of mixing these components is not particularly limited. For instance, all the components can be mixed at once or in a suitably selected order.

Although not particularly limited, from the standpoint of consistently (reproducibly) producing polishing compositions having less aggregates, can be preferably used, for instance, a production method comprising obtaining a dispersion comprising an abrasive (e.g. silica grains), a basic compound and water (or a "basic abrasive dispersion" hereinafter) and mixing the basic abrasive dispersion and a water-soluble polymer.

In such a basic abrasive dispersion containing both the abrasive and basic compound, the abrasive exhibits greater electrostatic repulsion due to the basic compound and thus shows higher dispersion stability than an abrasive dispersion free of a basic compound (which is typically almost neutral). Accordingly, local aggregation of the abrasive is less likely to occur as compared with an embodiment where the basic compound is added after addition of the water-soluble polymer to a neutral abrasive dispersion and an embodiment where the neutral abrasive dispersion, water-soluble polymer and basic compound are mixed all at once. This is preferable from the standpoint of increasing the ease of filtration of the polishing composition or reducing defects in the polished surface, etc.

The water-soluble polymer is preferably pre-dissolved in water and mixed in the form of an aqueous solution (or "aqueous polymer solution" hereinafter) with the basic abrasive dispersion. This can better inhibit local aggregation of the abrasive.

When mixing the basic abrasive dispersion and aqueous polymer solution, it is preferable to add the aqueous polymer solution to the basic abrasive dispersion. According to such a mixing method, local aggregation of the abrasive can be better prevented, for instance, as compared with a mixing method where the basic abrasive dispersion is added to the aqueous polymer solution. When the abrasive is silica grains (e.g. colloidal silica grains), it is particularly meaningful to use the mixing method by which an aqueous polymer solution is added to a basic abrasive dispersion as described above.

Among the abrasive, water-soluble polymer, basic compound and water forming the polishing composition to be produced, the basic abrasive dispersion comprises at least some of the abrasive, at least some of the basic compound and at least some of the water. For instance, in a preferable embodiment, the abrasive dispersion comprises all the abrasive forming the polishing composition, at least some of the basic compound and at least some of the water.

The basic compound content in the basic abrasive dispersion is preferably 0.01% by mass or greater, more preferably 0.05% by mass or greater, or yet more preferably 0.1% by mass or greater. With increasing basic compound content, there is a tendency for greater inhibition of the occurrence of local aggregation during preparation of the polishing composition. The basic compound content in the basic abrasive dispersion is preferably 10% by mass or less, more preferably 5% by mass or less, or yet more preferably 3% by mass or less. A lower basic compound content facilitates adjustment of the basic compound content in the polishing composition.

The basic abrasive dispersion has a pH of preferably 8 or higher, or more preferably 9 or higher. With increasing pH, there is a tendency for greater inhibition of the occurrence of local aggregation when the water-soluble polymer or an aqueous solution thereof is added to the basic abrasive dispersion. The pH of the basic abrasive dispersion is preferably 12 or lower, more preferably 11.5 or lower, or yet more preferably 10.5 or lower. With the pH of the basic abrasive dispersion being lower in the basic range, the amount of the basic compound required for preparing the dispersion is reduced, making it easier to adjust the basic compound content in the polishing composition. For instance, when the abrasive is silica grains, it is advantageous that the pH is not excessively high also from the standpoint of reducing dissolution of the silica. The mixture's pH can be adjusted by modifying the amount of the basic compound added, etc.

Such a basic abrasive dispersion can be prepared by mixing an abrasive, a basic compound and water. They can be mixed with a commonly known mixing device such as a propeller stirrer, ultrasonic disperser, homo mixer, etc. The mode of mixing the respective components of the basic abrasive dispersion is not particularly limited. For instance, the components can be mixed all at once or in a suitably selected order. An example of preferable embodiments is an embodiment where an approximately neutral dispersion comprising the abrasive and water is mixed with the basic compound or an aqueous solution thereof.

When mixing the water-soluble polymer in a form of an aqueous solution (aqueous polymer solution) into a basic abrasive dispersion, the water-soluble polymer content in the aqueous polymer solution is preferably 0.02% by mass or greater, more preferably 0.05% by mass or greater, or yet more preferably 0.1% by mass or greater. With increasing water-soluble polymer content, it becomes easier to adjust the water-soluble polymer content in the polishing composition. The water-soluble polymer content in the aqueous polymer solution is preferably 10% by mass or less, more preferably 5% by mass or less, or yet more preferably 3% by mass or less. With decreasing water-soluble polymer content, local aggregation of the abrasive tends to be more likely reduced when mixing the aqueous polymer solution with the basic abrasive dispersion.

The pH of the aqueous polymer solution is not particularly limited and can be adjusted, for instance, to pH 2 to 11. The pH of the aqueous polymer solution is adjusted preferably to around neutral to basic, or more preferably to basic. More specifically, the pH of the aqueous polymer solution is preferably 8 or higher, or more preferably 9 or higher. The pH can be adjusted by using some of the basic compound forming the polishing composition. The increased pH of the aqueous polymer solution can more greatly reduce local aggregation of the abrasive when the aqueous polymer solution is added to the basic abrasive dispersion. The pH of the aqueous polymer solution is preferably 12 or lower, or more preferably 10.5 or lower. When the pH of the aqueous polymer solution is lower in the basic range, the amount of the basic compound required for preparing the aqueous polymer solution is reduced, making it easier to adjust the basic compound content in the polishing composition. For instance, when the abrasive is silica grains, it is advantageous that the pH is not excessively high also from the standpoint of reducing dissolution of the silica.

The rate of adding the aqueous polymer solution to the basic abrasive dispersion is preferably, with respect to 1 L of the dispersion, at or below 500 mL of aqueous polymer solution per minute, more preferably at or below 100 mL/min, or yet more preferably at or below 50 mL/min. With decreasing supply rate, local aggregation of the abrasive can be more greatly reduced.

In a preferable embodiment, the aqueous polymer solution can be filtered before added to the basic abrasive dispersion. By filtering the aqueous polymer solution, the amounts of contaminants and aggregates in the aqueous polymer solution can be further reduced.

The filtration method is not particularly limited. Known filtration methods can be suitably employed such as natural filtration performed at normal pressure as well as suction filtration, pressure filtration, centrifugal filtration, etc. The filter used for filtration is preferably selected based on mesh size. From the standpoint of the productivity of polishing compositions, the filter's mesh size is preferably 0.05 μm or larger, more preferably 0.1 μm or larger, or yet more preferably 0.2 μm or larger. From the standpoint of increasing the effect of eliminating contaminants and aggregates, the filter's mesh size is preferably 100 μm or smaller, more preferably 70 μm or smaller, or yet more preferably 50 μm or smaller. The filter's material or construction is not particularly limited. Examples of the filter's material include cellulose, nylon, polysulfone, polyether sulfone, polypropylene, polytetrafluoroethylene (PTFE), polycarbonate, glass, etc. Examples of the filter's construction include depth, pleated, membrane, etc.

The polishing composition production method described above can be preferably applied when the polishing composition obtainable by mixing the basic abrasive dispersion and the water-soluble polymer or an aqueous solution thereof is a polishing liquid (working slurry) or has approximately the same NV as this as well as when it is a concentrate described later.

<Polishing>

The polishing composition disclosed herein can be preferably used for polishing a polishing object, for instance, in an embodiment comprising the following operations. Described below is a preferable embodiment of the method for polishing a polishing object using the polishing composition disclosed herein.

In particular, a polishing liquid (which is typically a slurry polishing liquid and sometimes called a polishing slurry) is obtained, comprising a polishing composition disclosed herein. The obtaining the polishing liquid may include, as described earlier, preparing the polishing liquid by subjecting the polishing composition to operations such as concentration adjustment (e.g. dilution), pH adjustment, etc. Alternatively, the polishing composition can be used straight as the polishing liquid.

Subsequently, the polishing slurry is supplied to a polishing object and polishing is carried out by a conventional method. For instance, when carrying out final polishing of a silicon wafer, the silicon wafer after a lapping step and first polishing step is set in a general polishing machine and via a polishing pad in the polishing machine, the polishing slurry is supplied to the surface (surface to be polished) of the silicon wafer. Typically, while the polishing slurry is continuously supplied, the polishing pad is pushed against the surface of the silicon wafer, and the two are moved (e.g. moved in circular motion) in coordination. Via such a polishing step, polishing of the polishing object is completed.

A polishing step such as the above may be part of production processes of polished articles (e.g. substrates such as silicon wafers, etc.). Accordingly, this specification provides a method for producing a polished article (preferably, a method for producing a silicon wafer), with the method comprising the polishing step.

The polishing pad(s) used in the polishing step using a polishing liquid comprising the polishing composition disclosed herein are not particularly limited. For instance, any of the non-woven fabric type, suede type, abrasive-bearing type, abrasive-free type, etc., can be used.

<Wash>

The polishing object polished with the polishing composition disclosed herein is typically washed after polished. The wash can be carried out, using a suitable wash solution. The wash solution used is not particularly limited. Usable examples include SC-1 wash solution (a mixture of ammonium hydroxide ($NH_4OH$), hydrogen peroxide ($H_2O_2$) and water ($H_2O$); washing with SC-1 wash solution is referred to as "SC-1 washing" hereinafter), SC-2 wash solution (a mixture of HCl, $H_2O_2$ and $H_2O$) and the like generally used in the field of semiconductors. The temperature of the wash solution can be, for instance, room temperature to about 90° C. From the standpoint of increasing the washing efficiency, a wash solution at about 50° C. to 85° C. can be preferably used.

<Concentrate>

The polishing composition disclosed herein may be in a concentrated form (i.e. in a form of a concentrate of the polishing liquid) before supplied to a polishing object. The polishing composition in a concentrated form as this is advantageous from the standpoint of the convenience and cost reduction for production, distribution, storage, etc. The concentration can be, for instance, about 2-fold to 100-fold by volume while it is usually suitably about 5-fold to 50-fold. The concentration of the polishing composition according to a preferable embodiment is 10-fold to 40-fold, for instance, 15-fold to 25-fold.

The polishing composition in a concentrate form as this can be used in an embodiment where it is diluted whenever desired to prepare a polishing liquid and the polishing liquid is supplied to a polishing object. The dilution can be carried out typically by adding and mixing an aforementioned aqueous solvent with the concentrate. When the aqueous solvent is a solvent mixture, the dilution can be performed by adding just some of the components of the aqueous solvent or by adding a solvent mixture comprising the components at a mass ratio different from that of the aqueous solvent.

The concentrate can have an NV of, for instance, 50% by mass or lower. From the standpoint of the stability (e.g. dispersion stability of the abrasive) and ease of filtration of the polishing composition, etc., usually, the concentrate has an NV of suitably 40% by mass or lower, preferably 30% by mass or lower, or yet more preferably 20% by mass or lower, for instance, 15% by mass or lower. From the standpoint of the convenience and cost reduction for production, distribution, storage and so on, the NV of the concentrate is suitably 0.5% by mass or higher, preferably 1% by mass or higher, or more preferably 3% by mass or higher, for instance, 5% by mass or higher.

The abrasive content in the concentrate can be, for instance, 50% by mass or lower. From the standpoint of the stability (e.g. dispersion stability of the abrasive) and ease of filtration of the polishing composition, etc., usually, the abrasive content is preferably 45% by mass or lower, or more preferably 40% by mass or lower. In a preferable embodiment, the abrasive content can be 30% by mass or lower, or even 20% by mass or lower (e.g. 15% by mass or lower). From the standpoint of the convenience and cost reduction for production, distribution, storage and so on, the abrasive content can be, for instance, 0.5% by mass or higher, preferably 1% by mass or higher, or more preferably 3% by mass or higher (e.g. 5% by mass or higher).

The water-soluble polymer content in the concentrate can be, for instance, 3% by mass or lower. From the standpoint of the ease of filtration and washability of the polishing composition, etc., usually, the water-soluble polymer content is preferably 1% by mass or lower, or more preferably 0.5% by mass or lower. From the standpoint of the convenience and cost reduction for production, distribution, storage and so on, the water-soluble polymer content is usually suitably $1 \times 10^{-3}$ or higher, preferably $5 \times 10^{-3}$ or higher, or more preferably $1 \times 10^{-2}$ or higher.

The polishing composition disclosed herein may be of a one-pack type or a multiple-pack type such as two-pack types. For example, it may be formulated such that liquid A including some of the components (typically, some of the components other than the aqueous solvent) of the polishing composition and liquid B including other components are mixed and the mixture is used for polishing of a polishing object. The art disclosed herein can be preferably implemented in an embodiment of, for instance, a one-pack type polishing composition.

Several worked examples relating to the present invention are described below although the present invention is not to be limited to such working examples. In the description below, "parts" and "%" are based on mass unless otherwise specified.

<Measurement of Adsorption Ratio (1)>

Were mixed a polyvinyl alcohol with a weight average molecular weight (Mw) of $1.3 \times 10^4$ (degree of saponification ≥95% by mole; "PVA-A" hereinafter), aqueous ammonia (29% concentration) and deionized water to prepare a test solution L0 containing 0.018% PVA-A and 0.01% ammonia ($NH_3$) with the rest being water. The test solution L0 was measured for total organic carbons (TOC), using a TOC analyzer (combustion catalytic oxidation method, model name "TOC-5000A") available from Shimadzu Corporation.

On the other hand, were mixed the same abrasive as the one used in Examples 1 to 8, 11, 12 and Comparative Examples 1 to 4 described later, PVA-A, aqueous ammonia (29% concentration) and deionized water to prepare a test solution L1 containing 0.18% abrasive, 0.018% PVA-A and 0.01% ammonia ($NH_3$) with the rest being water. The test solution L1 was centrifuged at a rotational speed of 20000 rpm for 30 minutes, using a centrifuge under model name "AVANTI HP-30I" available from Beckman Coulter, Inc. The centrifuged supernatant was collected and measured for TOC, using the TOC analyzer. From the TOC values of the test solution L0 and the supernatant of the test solution L1, the adsorption ratio of PVA-A was determined to be approximately 0%.

In place of PVA-A, were used individually a polyvinyl alcohol with Mw=$2.2 \times 10^4$ (degree of saponification ≥95% by mole; "PVA-B" hereinafter), a polyvinyl alcohol with Mw=$7.5 \times 10^4$ (degree of saponification ≥95% by mole; "PVA-C" hereinafter) and a polyvinyl alcohol with Mw=$1.3 \times 10^4$ (80% by mole vinyl alcohol unit, 20% by mole vinyl hexanoate unit; "PVA-D" hereinafter). For each, the adsorption ratio was determined in the same manner. As a result, for all PVA-B, PVA-C and PVA-D, the adsorption ratio was approximately 0%.

In place of PVA-A, were used individually a polyacryloylmorpholine with Mw=$4.5 \times 10^4$ ("PACMO-A" hereinafter), a polyacryloylmorpholine with Mw=$15 \times 10^4$ ("PACMO-B" hereinafter), a polyacryloylmorpholine with Mw=$35 \times 10^4$ ("PACMO-C" hereinafter), a polyisopropylacrylamide with Mw=$6.0 \times 10^4$ ("PNIPAM" hereinafter), a polyvinylpyrrolidone with Mw=$4.5 \times 10^4$ ("PVP-A") and a polyvinylpyrrolidone with Mw=$6.0 \times 10^4$ ("PVP-B" hereinafter). For each, the adsorption ratio was determined. As a result, the adsorption ratios were 15% for PACMO-A, 20% for PACMO-B, 30% for PACMO-C, 35% for PNIPAM, 90% for PVP-A and 90% for PVP-B.

<Measurement of Adsorption Ratio (2)>

The same abrasive as the one used in Examples 9 and 10 described later was used in preparing a test solution L1. Otherwise in the same manner as the measurement of adsorption ratio (1), the adsorption ratio was measured for PVA-D, a polyvinyl alcohol with Mw=$0.3 \times 10^4$ (80% by mole vinyl alcohol unit, 20% by mole vinyl hexanoate unit; "PVA-E" hereinafter) and PVP-A. As a result, the adsorption ratios of PVA-D and PVA-E were approximately 0% while the adsorption ratio of PVP-A was 90%.

Preparation of Polishing Compositions

Example 1

An abrasive, a water-soluble polymer and aqueous ammonia (29% concentration) and deionized water were mixed to obtain a polishing composition concentrate. The concentrate was diluted 20 times with deionized water to prepare a polishing composition according to Example 1.

As the abrasive, was used a colloidal silica of 25 nm average primary particle diameter and 46 nm average secondary particle diameter. The average primary particle diameter was measured with a surface area analyzer under trade name "FLOW SORB II 2300" available from Micromeritics. The average secondary particle diameter was the volume average secondary particle diameter measured with a model "UPA-UT151" available from Nikkiso Co., Ltd. (the same applies to the examples below).

As the water-soluble polymer, PVA-A and PACMO-A were used at a mass ratio of 50:50.

The abrasive, water-soluble polymer and aqueous ammonia were used in amounts equivalent to a 0.18% abrasive content, 0.018% water-soluble polymer content (PVA-A and PACMO-A combined) and 0.01% ammonia ($NH_3$) content, respectively, in the polishing composition. The polishing composition had a pH of 10.2.

Example 2

As the water-soluble polymer, PVA-A and PACMO-A were used at a mass ratio of 30:70. Otherwise, in the same manner as Example 1, a polishing composition according to Example 2 was prepared.

Example 3

As the water-soluble polymer, PVA-A and PACMO-A were used at a mass ratio of 25:75. Otherwise, in the same manner as Example 1, a polishing composition according to Example 3 was prepared.

Example 4

As the water-soluble polymer, PVA-A and PACMO-A were used at a mass ratio of 75:25. Otherwise, in the same manner as Example 1, a polishing composition according to Example 4 was prepared.

Example 5

As the water-soluble polymer, PVA-B and PNIPAM were used at a mass ratio of 50:50. Otherwise, in the same manner as Example 1, a polishing composition according to Example 5 was prepared.

Example 6

In this example, the abrasive, water-soluble polymer and aqueous ammonia were used in amounts equivalent to a 0.09% abrasive content, 0.010% water-soluble polymer content (PVA-A and PACMO-A combined) and 0.005% ammonia content ($NH_3$), respectively, in the polishing composition. Otherwise, in the same manner as Example 1, a polishing composition according to Example 6 was prepared.

Example 7

As the water-soluble polymer, PVA-D and PACMO-A were used at a mass ratio of 50:50. Otherwise, in the same manner as Example 6, a polishing composition according to Example 7 was prepared.

Example 8

As the water-soluble polymer, PVA-D and PVP-A were used at a mass ratio of 50:50. Otherwise, in the same manner as Example 6, a polishing composition according to Example 8 was prepared.

Example 9

In this example, as the abrasive, was used a colloidal silica of 35 nm average primary particle diameter and 66 nm average secondary particle diameter. As the water-soluble polymer, PVA-D and PVP-A were used at a mass ratio of 30:70. The abrasive, water-soluble polymer and aqueous ammonia were used in amounts equivalent to a 0.50% abrasive content, 0.008% water-soluble polymer content (PVA-D and PVP-A combined) and 0.01% ammonia content ($NH_3$), respectively, in the polishing composition. Otherwise, in the same manner as Example 1, a polishing composition according to Example 9 was prepared.

Example 10

As the water-soluble polymer, PVA-E and PVP-A were used at a mass ratio of 30:70. Otherwise, in the same manner as Example 9, a polishing composition according to Example 10 was prepared.

Example 11

As the water-soluble polymer, PVA-A and PACMO-B were used at a mass ratio of 50:50. Otherwise, in the same manner as Example 6, a polishing composition according to Example 11 was prepared.

Example 12

As the water-soluble polymer, PVA-A and PACMO-C were used at a mass ratio of 50:50. Otherwise, in the same manner as Example 6, a polishing composition according to Example 12 was prepared.

Comparative Example 1

As the water-soluble polymer, PVA-A was used solely. Otherwise, in the same manner as Example 1, a polishing composition according to Comparative Example 1 was prepared.

Comparative Example 2

As the water-soluble polymer, PACMO-A was used solely. Otherwise, in the same manner as Example 1, a polishing composition according to Comparative Example 2 was prepared.

Comparative Example 3

As the water-soluble polymer, PVA-B and PVA-C were used at a mass ratio of 50:50. Otherwise, in the same manner as Example 1, a polishing composition according to Comparative Example 3 was prepared.

Comparative Example 4

As the water-soluble polymer, PACMO-A and PVP-B were used at a mass ratio of 50:50. Otherwise, in the same manner as Example 1, a polishing composition according to Comparative Example 4 was prepared.

<Silicon Wafer Polishing>

Using the polishing compositions according to the respective examples as they were as polishing liquids, silicon wafer surfaces were polished under the conditions shown below. The silicon wafers used had 300 mm diameter, p-type conductivity, crystal orientation of <100> and a resistivity of 0.1 Ω·cm or greater, but less than 100 Ω·cm, and were preliminarily polished with a polishing slurry (trade name "GLANZOX 2100" available from Fujimi, Inc.) to a surface roughness of 0.1 nm to 10 nm for the use.

[Polishing Conditions]

Polishing machine: Sheet-type polisher with model number "PNX-332B" available from Okamoto Machine Tool Works, Ltd.

Polishing tables: Using two rear tables among three tables of the polishing machine, the first and second stages of final polishing after the preliminary polishing were carried out. (The conditions below were common between the two tables)

Polishing pressure: 15 kPa
Plate rotational speed: 30 rpm
Head rotational speed: 30 rpm
Polishing time: 2 min
Temperature of polishing liquid: 20° C.
Flow rate of polishing liquid: 2.0 L/min (drain)

<Wash>

Polished silicon wafers were washed (SC-1 washed) with a wash solution at $NH_4OH$ (29%)/$H_2O_2$ (31%)/deionized water (DIW)=1/3/30 (volume ratio). More specifically, two washing baths each equipped with an ultrasonic wave oscillator of 950 kHz frequency were obtained; the wash solution was placed in each of the first and second washing baths and maintained at 60° C.; and each polished silicon wafer was immersed in the first washing bath for 6 minutes and then, via a ultrasonic rinsing bath with ultrapure water, in the second washing bath for 6 minutes, with the respective ultrasonic wave oscillators turned on.

<Assessment of the Number of Micro Particles>

Using a wafer inspection system under trade name "SURFSCAN SP2" available from KLA-Tencor Corporation, the number of 37 nm or larger particles (number of LPD) present on each washed silicon wafer of 300 mm diameter was counted. The results are converted to the relative values, with the number of LPD in Comparative Example 1 being 100%, and shown in Table 1.

<Haze Measurement>

The surface of the respective washed silicon wafers were measured for haze (ppm) in DWO mode, using a wafer inspection system under trade name "SURFSCAN SP2" available from KLA-Tencor Corporation. The results are converted to the relative values, with the haze value of Comparative Example 1 being 100%, and shown in Table 1.

TABLE 1

| | Polymer A | | | Polymer B | | | Evaluation | |
|---|---|---|---|---|---|---|---|---|
| | Species | Mw ($\times 10^4$) | Adsorption ratio (%) | Species | Mw ($\times 10^4$) | Adsorption ratio (%) | Ratio in polymer A (wt %):B (wt %) | LPD (%) | Haze (%) |
| Ex. 1 | PVA-A | 1.3 | 0 | PACMO-A | 4.5 | 15 | 50:50 | 33 | 80 |
| Ex. 2 | PVA-A | 1.3 | 0 | PACMO-A | 4.5 | 15 | 30:70 | 35 | 85 |
| Ex. 3 | PVA-A | 1.3 | 0 | PACMO-A | 4.5 | 15 | 25:75 | 40 | 87 |
| Ex. 4 | PVA-A | 1.3 | 0 | PACMO-A | 4.5 | 15 | 75:25 | 50 | 90 |
| Ex. 5 | PVA-B | 2.2 | 0 | PNIPAM | 6.0 | 35 | 50:50 | 80 | 90 |
| Ex. 6 | PVA-A | 1.3 | 0 | PACMO-A | 4.5 | 15 | 50:50 | 30 | 85 |
| Ex. 7 | PVA-D | 1.3 | 0 | PACMO-A | 4.5 | 15 | 50:50 | 30 | 80 |
| Ex. 8 | PVA-D | 1.3 | 0 | PVP-A | 4.5 | 90 | 50:50 | 20 | 80 |
| Ex. 9 | PVA-D | 1.3 | 0 | PVP-A | 4.5 | 90 | 30:70 | 40 | 90 |
| Ex. 10 | PVA-E | 0.3 | 0 | PVP-A | 4.5 | 90 | 30:70 | 30 | 80 |
| Ex. 11 | PVA-A | 1.3 | 0 | PACMO-B | 15 | 20 | 50:50 | 20 | 90 |
| Ex. 12 | PVA-A | 1.3 | 0 | PACMO-C | 35 | 30 | 50:50 | 30 | 95 |
| Comp. Ex. 1 | PVA-A | 1.3 | 0 | — | — | — | 100:0 | 100 | 100 |
| Comp. Ex. 2 | — | — | — | PACMO-A | 4.5 | 15 | 0:100 | 150 | 110 |
| Comp. Ex. 3 | PVA-B | 2.2 | 0 | — | — | — | 50:0 | 110 | 100 |
| | PVA-C | 7.5 | 0 | | | | 50 | | |
| Comp. Ex. 4 | — | — | — | PACMO-A | 4.5 | 15 | 0:50 | 150 | 130 |
| | | | | PVP-B | 6.0 | 90 | 50 | | |

As shown in Table 1, with respect to the polishing compositions of Examples 1 to 12 using a polymer A and a polymer B in combination as the water-soluble polymer, all exhibited excellent effect of LPD reduction by number and haze reduction when compared with Comparative Example 1 using solely a single species of polymer A and Comparative Example 2 using solely a single species of polymer B. Particularly great results were obtained with the polishing compositions of Examples 1 to 4 and 6 to 12 wherein the polymer B's Mw was three times the polymer A's Mw or larger.

On the contrary, unlike Examples 1 to 12, the combination of water-soluble polymers did not yield any effect to reduce the number of LPD or haze in Comparative Example 3 using just two species of polymer A in combination as the water-soluble polymer or in Comparative Example 4 using just two species of polymer B in combination.

Although specific embodiments of the present invention have been described in detail above, these are merely for illustrations and do not limit the scope of claims. The art according to the claims includes various modifications and changes made to the specific embodiments illustrated above.

The invention claimed is:

1. A polishing composition comprising an abrasive, a water-soluble polymer and water, the composition comprising, as the water-soluble polymer,
   a polymer A having an adsorption ratio of lower than 5% and a polymer B having an adsorption ratio of 5% or higher, but lower than 95% based on an adsorption ratio measurement as follows:
   (1) a test solution L0 is obtained, comprising 0.018% by mass of a measured polymer and 0.01% by mass of ammonia with the rest being water;
   (2) a test solution L1 is obtained, comprising 0.18% by mass of the abrasive as well as 0.018% by mass of the measured polymer and 0.01% by mass of ammonia with the rest being water;
   (3) the test solution L1 is centrifuged to precipitate the abrasive; and
   (4) the measured polymer in the test solution L0 has a mass W0, the measured polymer in the supernatant of the centrifuged test solution L1 has a mass W1, and the measured polymer has an adsorption ratio determined by the next equation:

Adsorption ratio (%)=[(W0−W1)/W0]×100;

wherein, the polymer B is selected from polymers excluding hydroxyethyl celluloses.

2. The polishing composition according to claim 1, wherein the polymer B has a weight average molecular weight (Mw) to number average molecular weight (Mn) ratio (Mw/Mn) of 5.0 or lower.

3. The polishing composition according to claim 1, wherein the polymer B has a weight average molecular weight (Mw) of $1\times10^4$ or larger, but smaller than $25\times10^4$.

4. The polishing composition according to claim 1, wherein the polymer B is a nonionic polymer.

5. The polishing composition according to claim 1, wherein the polymer B comprises a pendant group having an amide bond.

6. The polishing composition according to claim 1, wherein the polymer A is a polyvinyl alcohol.

7. The polishing composition according to claim 1, further comprising a basic compound.

8. The polishing composition according to claim 1 used for polishing a silicon wafer.

9. A method for producing a polished article, the method comprising:
   obtaining a polishing liquid that comprises the polishing composition according to claim 1;
   supplying the polishing liquid to a polishing object; and
   polishing a surface of the polishing object with the polishing liquid.

10. The polished article production method according to claim 9, wherein the polishing object is a silicon wafer.

* * * * *